(12) United States Patent
Ono et al.

(10) Patent No.: US 6,252,156 B1
(45) Date of Patent: Jun. 26, 2001

(54) PHOTOSENSITIVE SEMICONDUCTOR ELECTRODE, METHOD OF MANUFACTURING PHOTOSENSITIVE SEMICONDUCTOR ELECTRODE, AND PHOTOELECTRIC CONVERTER USING PHOTOSENSITIVE SEMICONDUCTOR

(75) Inventors: Yoshiyuki Ono; Hidekazu Hirose; Katsuhiro Sato; Akira Imai, all of Minami-Ashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/098,519

(22) Filed: Jun. 17, 1998

(30) Foreign Application Priority Data

Jun. 24, 1997 (JP) .................................................. 9-167074
Nov. 6, 1997 (JP) .................................................. 9-304615

(51) Int. Cl.⁷ ......................... H01L 31/0264; H01L 21/02
(52) U.S. Cl. ............................................. 136/256; 438/85
(58) Field of Search ..................................... 502/350, 343, 502/305, 312, 352, 345, 340; 136/256; 438/85

(56) References Cited

U.S. PATENT DOCUMENTS 4,904,526 * 2/1990 Koskenmaki .
4,977,127 * 12/1990 Rikimaru .
5,136,351 * 8/1992 Inoue et al. .
5,155,086 * 10/1992 Thakur et al. .
5,482,570 * 1/1996 Saurer et al. .
5,916,837 * 6/1999 Harmer et al. .
5,935,897 * 8/1999 Truenbach et al. .

FOREIGN PATENT DOCUMENTS

| 1-220380 | 9/1989 | (JP) . |
| 3-114150 | 5/1991 | (JP) . |
| 5-59562 | 3/1993 | (JP) . |
| 8-99041 | 4/1996 | (JP) . |

* cited by examiner

Primary Examiner—Steven P. Griffin
Assistant Examiner—Christina Ildebrando
(74) Attorney, Agent, or Firm—Oliff & Berridge, PLC

(57) ABSTRACT

Disclosed is an aggregate of metal oxide fine particles having fine pores whose size frequency distribution has a plurality of peaks. Disclosed also is a method preferably used for producing the aggregate of metal oxide fine particles. The method comprises a step of reacting a precursor of a metal oxide with a compound interacting with the precursor in a solvent to yield metal oxide fine particles. Also disclosed are a photosensitive semiconductor comprising a substrate, and a metal oxide porous body having fine pores whose size frequency distribution has a plurality of peaks and a method preferably used for manufacturing the photosensitive semiconductor electrode. This photosensitive semiconductor electrode has a high energy conversion efficiency and is preferably used in a photoelectric converter.

10 Claims, 7 Drawing Sheets

PHOTOSENSITIVE SEMICONDUCTOR ELECTRODE, METHOD OF MANUFACTURING PHOTOSENSITIVE SEMICONDUCTOR ELECTRODE, AND PHOTOELECTRIC CONVERTER USING PHOTOSENSITIVE SEMICONDUCTOR

BACKGROUND OF THE INVENTION

1. Field of the Invention

The present invention relates to an aggregate of metal oxide fine particles suitable as photovoltaic materials, photoconductive materials, and photocatalytic materials and a method for producing the aggregate. The present invention also relates to a photosensitive semiconductor electrode preferably used for photocells, photoconductive devices, display devices, and various sensors using the aggregate and a method of manufacturing the photosensitive semiconductor electrodes.

2. Prior Art

Global warming caused by the burning of fossil fuels and an increased energy demand arising from the increasing population are an important theme relating to human life and death. Sunlight, needless to say, has grown the environment of this planet and has been an energy source for all life including mankind on this planet since the beginning of life. Considerable research is being carried out on how to exploit sunlight as a clean energy source which is inexhaustible and produces no toxic substances. Particularly so-called solar cells which convert optical energy to electric energy have lately attracted considerable attention as a powerful technology. As a photovoltaic material for the solar cells, a monocrystal, polycrystal, or amorphous silicon, or a semiconductor compound such as CuInSe, GaAs, or CdS is used. Solar cells using these inorganic semiconductors exhibit the relatively high energy conversion efficiency as high as 10% to 20%. These solar cells are therefore widely used as power sources in remote locations or as auxiliary power sources for portable small electronic instruments.

However, if the aim is to prevent further harm to the Earth's environment by curbing the consumption of fossil fuels, as was mentioned above, then, at the present time, it cannot easily be said that solar cells using inorganic semiconductors are sufficiently effective. This is because solar cells using these inorganic semiconductors are produced by a plasma CVD method or a high temperature crystal growth process and the production of these devices requires a lot of energy. Further, these devices contain components such as Cd, As, and Se which are likely to harm the environment, so that there is the fear of the environment being harmed by waste devices.

In order to solve these problems, a photoelectrochemical energy conversion equipment is awaited which makes use of a photoelectrochemical reaction arising in the boundary between a photosensitive semiconductor (a semiconductor wherein carriers are generated by irradiation with light) and an electrolytic solution. Fujishima and et al. found that, when a titanium oxide electrode in an aqueous solution is irradiated with light, oxygen and hydrogen are produced by the decomposition of water while a photoelectric current flows between the titanium oxide electrode and a platinum electrode as the counter electrode (A. Fujishima, K. Honda, Nature, 238, 37 (1972)). This photoelectrochemical energy conversion equipment is attracting considerable attention since it converts solar energy into electric energy and decomposes water, which is an inexhaustible natural resource, to generate hydrogen whose use as a clean fuel is anticipated.

Titanium oxide is photoelectrochemically stable and has excellent characteristics for use as the material for photosensitive semiconductor electrodes in such an equipment. On the other hand, titanium oxide has the drawback of possessing a band gap as large as 3.0 eV and has hence poor spectrum matching with solar light whereby the photoelectric conversion efficiency of the equipment is reduced.

In order to improve the characteristics of titanium oxide, a process in which an organic dye is adsorbed by the surface of the titanium oxide thereby sensitizing the titanium oxide is being examined (H. Tsubomura, Sol. Energy, 21, 93 (1978)). There is also a proposal in which titanium oxide with a large specific surface area is used as the material for a photosensitive semiconductor electrode, based on the observation that only a dye adsorbed by the surface contributes to an increase in the sensitivity, and a sensitizing dye is allowed to be adsorbed by the surface of titanium oxide (Japanese Patent Application Laid-Open (JP-A) No. 1-220380).

A metal alkoxide hydrolysis colloidal method is proposed as a means of preparing a metal oxide thin film having a large specific surface area (Japanese Patent ApplicationLaid-Open (JP-A) No.3-114150). In this method, an excessive amount of water is added to an alcohol solution of a metal alkoxide in the presence of a deflocculant, for example nitric acid, which is added to stabilize the dispersion, which is then heated to hydrolyze the metal alkoxide thereby preparing a colloidal solution in which fine particles of a metal oxide are dispersed. The colloidal solution is then applied to an appropriate substrate which is then sintered to obtain a film of metal oxide fine particles. This method makes it possible to produce a film wherein titanium oxide ultra fine particles with a grain size of tens of nanometers are deposited. However, since the clearances between particles are smaller than the grain size of the particles, though the specific surface area of the titanium oxide fine particles forming the film is large, the sensitizing dye cannot penetrate into the inside of the film and the adsorption of the dye reaches its saturation limit immediately if the film is thick, giving rise to the problem of insufficient adsorption of the dye.

There is also a proposed method in which from 1 mol to 2 mols water is added for each mol of titanium alkoxide used as a raw material, the mixture is heated so as to prepare a transparent sol in which titanium alkoxide is partially hydrolyzed, and polyethylene glycol and the like are mixed with the transparent sol, which is then sintered to form a titanium oxide thin film having pores on its surface (Japanese PatentApplication Laid-Open (JP-A) No. 8-099041). This method, however, has the drawbacks that apart from the areas of the pores the film becomes denser and hence the amount of dye adsorbed is small, and that the thickness of the film which can be formed by one application is thin (0.05 $\mu$m or less). It is necessary to repeat the application and sintering process many times in order for a sufficient amount of the dye to be absorbed. This requires complicated production steps bringing about a long production time and a large production cost.

SUMMARY OF THE INVENTION

In view of this situation, the present invention has been conducted and has an object of providing an aggregate of metal oxide fine particles suitable as photosensitive semiconductor electrodes and a method of producing the aggregate of metal oxide fine particles in a simple and efficient manner. Another object of the present invention is to provide a photosensitive semiconductor electrode enabling energy conversion of solar light in an efficient manner. A further object of the present invention is to provide a method of manufacturing a photosensitive semiconductor electrode simply and efficiently. A still further object of the present invention is to provide a photoelectric converter having a high energy conversion rate.

The present invention relates to an aggregate of metal oxide fine particles having fine pores whose size frequency distribution has a plurality of peaks. The aggregate of metal oxide fine particles has a large specific surface area and promotes inward penetration of functional molecules such as sensitizing dye molecules. The use of this aggregate as photosensitive semiconductor electrodes or the like is therefore suitable.

Among the above aggregates of metal oxide fine particles, preferable are those in which at least one of the plurality of peaks is a peak corresponding to a circle equivalent radius ranging from $1.0 \times 10^2$ to $1.0 \times 10^4$ Å and at least one of the plurality of peaks is a peak corresponding to a circle equivalent radius ranging from 10 to $1.0 \times 10^2$ Å.

The present invention also relates to a method of producing an aggregate of metal oxide fine particles comprising a step of reacting a precursor of a metal oxide with a compound interacting with the precursor in a solvent to yield metal oxide fine particles. Preferably the compound interacting with the precursor of a metal oxide is a polymer compound and has functional groups interacting with the metal oxide precursor in the structure.

Among these production methods, a preferable method of producing an aggregate of metal oxide fine particles comprises a step of reacting a precursor of a metal oxide with a compound interacting with the precursor in a solvent to prepare a complex gel, which is further reacted to produce a colloidal dispersion sol of metal oxide fine particles and a step of drying the sol.

In the step of drying the colloidal dispersion sol of metal oxide fine particles, preferably the sol is applied in the form of a thin film and the thin film of the sol is dried and/or sintered. This makes it possible to produce a thin film aggregate of metal oxide fine particles with ease.

The present invention also relates to a photosensitive semiconductor electrode comprising a substrate, and thereon a metal oxide porous body having fine pores whose size frequency distribution has a plurality of peaks. This photosensitive semiconductor electrode possesses a high photoelectric energy conversion efficiency. Preferably the metal oxide porous body supports functional molecules. Preferably the functional molecule is a sensitizing dye.

The present invention also relates to a method of producing a photosensitive semiconductor comprising a step of reacting a precursor of a metal oxide with a compound interacting with the precursor in a solvent to prepare a complex gel, which is further reacted to produce a colloidal dispersion sol of metal oxide fine particles and a step of applying a solution of the sol on a substrate followed by sintering to form a metal oxide porous body on the substrate. Preferably the method further comprises a step of dipping the substrate in a liquid containing functional molecules after the metal oxide porous body is formed on the substrate and then allowing the functional molecule to penetrate into the inside of the metal oxide porous body so that the functional molecules are supported inside the metal oxide porous body. The photoelectric energy conversion efficiency is thereby improved.

The present invention also relates to a photoelectric converter having a photosensitive semiconductor electrode comprising a substrate, and thereon a metal oxide porous body having fine pores whose size frequency distribution has a plurality of peaks. Preferably the metal oxide porous body supports functional molecules thereby improving the photoelectric energy conversion efficiency.

DETAILED DESCRIPTION OF THE PREFERRED EMBODIMENTS

Aggregate of Metal Oxide Fine Particles

The aggregate of metal oxide fine particles according to the present invention is characterized in that the size frequency distribution of the fine pores possesses a plurality of peaks. In other words, when depicting a graph showing the pore size frequency distribution of the fine pores formed in the aggregate of metal oxide fine particles, the curve in the graph possesses two or more maximal values. This indicates that fine pores with a plurality of pore sizes, large and small, exist in the aggregate of metal oxide fine particles.

The term "a size of fine pores" herein denotes the radius of a circle (a circle equivalent radius) having the same area as the area of a pore in the section of the aggregate of metal oxide fine particles.

Figure 1:
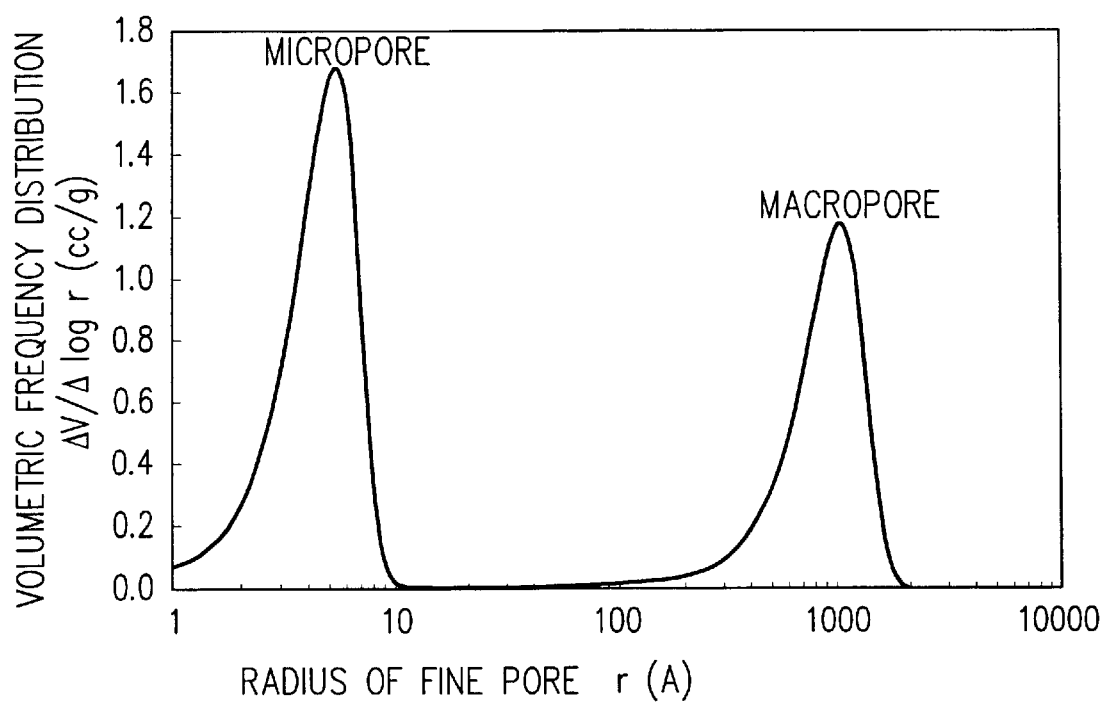
FIG. 1 is an example of a graph showing the pore size frequency distribution of fine particles of an aggregate of metal oxide fine particles according to the present invention.

There must be a plurality of peaks present, although the presence of two peaks is sufficient. FIG. 1 shows the size frequency distribution of the fine pores in an aggregate of metal oxide fine particles when two peaks are present. The aggregate of metal oxide fine particles preferably has at least one micropore with a small pore size and at least one macropore with a size relatively larger than that of the micropore. This presence of the micropore and macropore in the aggregate of metal oxide fine particles is an essential feature of the photosensitive semiconductor electrode of the present invention. The terms "micropore" and "macropore" which correspond to the peaks herein do not indicate only the diameters of the pores in the peak regions of the graph (the maximal values), but also include the pores in the shoulder regions thereof.

The critical radius of the fine pore which differentiates the micropore from the macropore is about 100 Å. Accordingly, it is preferable that the radius of the micropore be in a range from 10 to less than $1.0 \times 10^2$ Å and the macropore be in a range from $1.0 \times 10^2$ to $1.0 \times 10^4$ Å. However, the preferable ranges are not limited to the above defined ranges because these ranges differ depending on the size of the functional molecules supported by the aggregate of metal oxide fine particles and the use of the aggregate of metal oxide fine particles. In order to apportion the roles of the micropore and macropore, the ranges of the radiuses of both are preferably set apart. Preferably the size of the macropore is such that the functional molecule and other adsorbates can sufficiently penetrate into the inside of the aggregate of metal oxide fine particles and the size of the micropore is such that these adsorbates can adsorb and the aggregate of metal oxide fine particles can secure a sufficient specific surface area. The radius of the micropore is, more specifically, preferably in a range from 10 to less than $1.0 \times 10^2$ Å and a more preferable radius of the macropore is from $5.0 \times 10^2$ to $5.0 \times 10^3$ Å.

The size frequency distribution of the fine pores of the aggregate of metal oxide fine particles can be determined by a conventionally known method. The distribution of fine pores with a radius smaller than 1,000 Å can be measured by a gas adsorption method calculated from the absorption isotherm of nitrogen, krypton, or the like. The distribution of fine pores with a radius greater than 1,000 Å can be measured by a mercury press-in method using a porosimeter.

Figure 2:
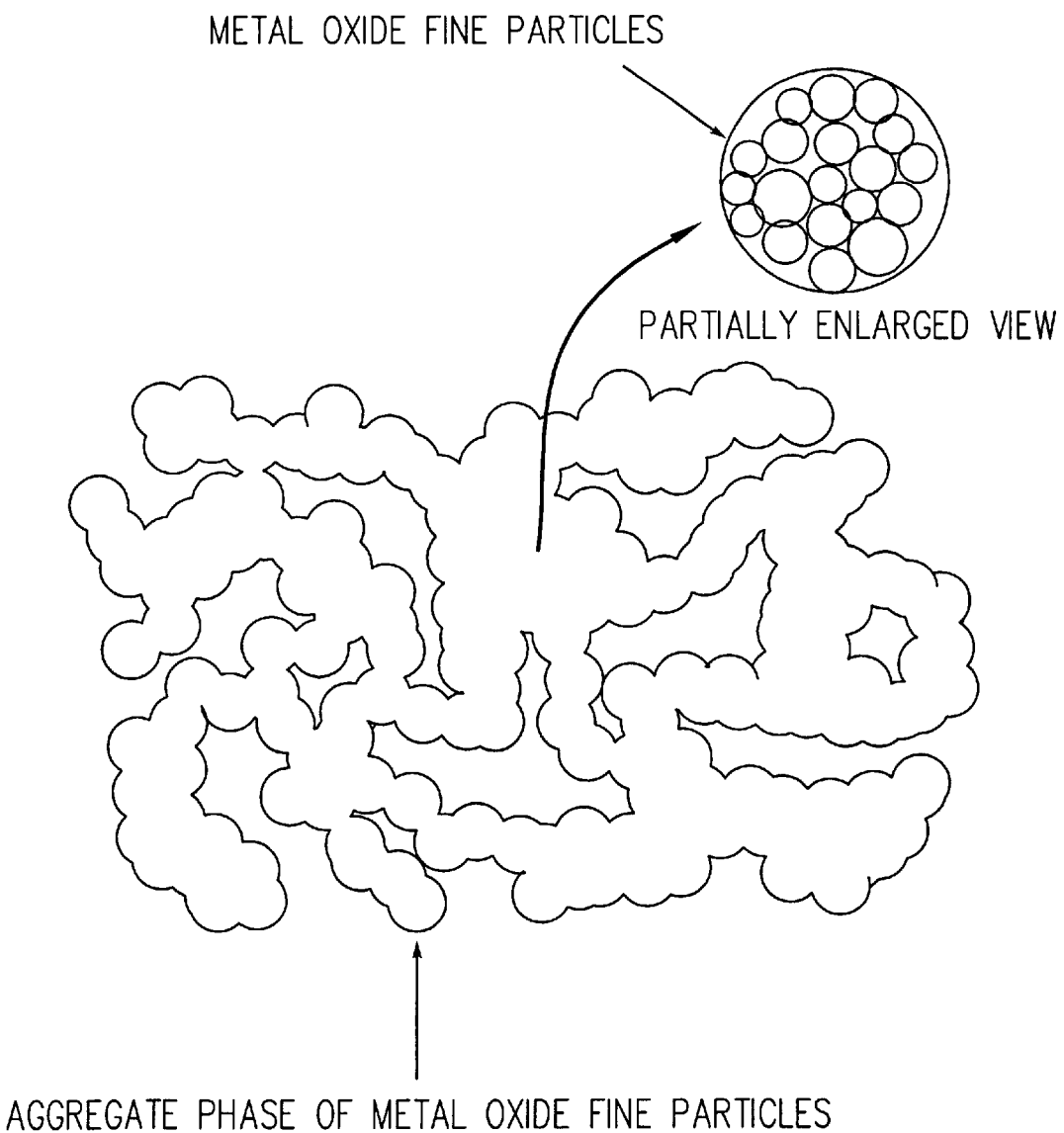
FIG. 2 is an enlarged typical view showing an example of a structure of an aggregate of metal oxide fine particles according to the present invention.

FIG. 2 is an enlarged typical view showing an example of a structure of an aggregate of metal oxide fine particles which has two peaks. In FIG. 2, the aggregate of metal oxide fine particles forms a phase separation structure in which a phase consisting of an aggregated plurality of metal oxide fine particles is isolated from a void phase with no metal oxide fine particles. The phase consisting of the aggregated metal oxide fine particles exhibits a three-dimensional continuous network phase. This type of structure ensures that voids with a small pore size (the micropore, see the enlarged view of FIG. 2) is formed between these fine particles and a void with a pore size larger than the former voids (the macropore) are formed between the phases of aggregated metal oxide fine particles.

Though a method of depositing the metal oxide fine particles is effective to form the aggregate of metal oxide fine particles having a large specific surface area, simply depositing metal oxide fine particles results in the production of voids with a size smaller than the fine particles. If the aggregate of metal oxide fine particles formed in this manner is used for a dye sensitized photosensitive electrode, the specific surface area is large but the dye is only able to penetrate inside a film with difficulty and, as a consequence, the absorption of a dye per unit of film thickness decreases with an increase in the film thickness. On the other hand, because the aggregate of metal oxide fine particles shown in FIG. 2 has a phase separation structure in which a phase consisting of aggregated metal oxide fine particles is isolated from a void phase with no metal oxide fine particles, a large volumetric void is created and the dye can thereby penetrate deep into the film.

Though no particular limitations is imposed on the grain size of the metal oxide fine particles and the optimum value of the grain size differs depending on the characteristics required for the object element, the grain size is preferably small to increase the specific surface area of the aggregate of metal oxide fine particles. The grain size is preferably smaller than 1,000 Å particularly when the metal oxide fine particles are used as a dye sensitized photosensitive electrode. Though the structure of the aggregate of metal oxide fine particles is affected by various parameters besides the grain size, there are no specific limitations to these parameters and these parameters may be determined according to the use. For example, considering the phase separation structure topologically, a three-dimensionally continuous aggregate phase is desirable in view of the mechanical strength and electronic properties of the device. As for the volumetric ratio of the aggregate phase and the voidphase, it is natural from the purpose of the invention that a void phase with a volumetric ratio more than a certain level is required. However, an excessive void phase leads to a reduction in the surface area per unit film thickness and the effect of the invention is thereby offset. It is therefore desirable that the volumetric ratio of the aggregate phase and the void phase be designed so that no more void than that required for the diffusion of the functional molecules and other adsorbates is generated.

Method of Production of the Aggreaate of Metal Oxide Fine Particles

The method of producing the aggregate of metal oxide fine particles according to the present invention preferably includes a step of reacting a precursor of a metal oxide with a compound interacting with the precursor in a solvent to produce a metal oxide. If the precursor of a metal oxide is reacted with the compound interacting with the precursor in a solvent to prepare a complex gel containing the precursor of a metal oxide, the gel can be formed into a sol again by the interaction between the precursor of a metal oxide and the above compound. This enables the aggregate to obtain excellent processability.

Before the compound interacting with the precursor of a metal oxide is added to a solution containing the precursor of a metal oxide, preferably water is added in an amount insufficient to hydrolyze the precursor of a metal oxide sufficiently thereby allowing the precursor to be partially hydrolyzed. The size and the like of the metal oxide fine particles can be controlled by this regulation of the amount of water.

The compound interacting with the precursor of a metal oxide contains at least two functional groups such as a carboxyl group, amino group, and hydroxyl group, which interact with the precursor of a metal oxide. The compound is preferably a high molecular weight compound though it may be a low molecular weight compound. It may be also a compound such as an amide acid (or acid amide) which has plural functional groups.

Examples of the low molecular weight compound interacting with the precursor of a metal oxide include dicarboxylic acid, diamine, diol, and diamide acid.

As the polymer compound interacting with the precursor of a metal oxide, polymers having a carboxyl group, amino group, hydroxyl group, or amide acid structure in the primary chain or side chain are exemplified. No particular limitations are imposed on the primary chain structure of the polymer, examples of an optional primary chain structure, such as a primary chain structure of polyethylene based resin, polystyrene based resin, polyacrylate based resin, polymethacrylate based resin, polycarbonate based resin, polyester based resin, cellulose resin, silicon based resin, vinyl based polymer, polyamide based resin, polyamideimide based resin, polyurethane based resin, polyurea based resin, or copolymers of these. The polymer compound interacting with the precursor of a metal oxide is selected from compounds having the above primary chain structure and at least two functional groups in the side chain or the cross-linking chain portion, the functional group interacting with the precursor of a metal oxide and including an carboxyl group, amino group, hydroxyl group, or amid acid structure.

Among these polymers, a polyacrylic acid having a carboxyl group in the side chain has a suitable configuration for interacting with the precursor of a metal oxide and is therefore particularly preferable.

The polymer may be a copolymer which has the above primary chain structure and contains the monomer moieties which has no functional groups interacting with the precursor. Combinations of two or more of the above polymers or combinations of the above polymers and a polymer having the same primary chain structure as above and no functional group interacting with the precursor may be used according to the object.

The precursor of a metal oxide is a compound which can be converted into a metal oxide such as titanium oxide, zinc oxide, tungsten oxide, vanadium oxide, tin oxide, copper oxide, or strontium titanate. As the precursor, for example, a metal compound such as a corresponding metal halide, metal complex compound, metal alkoxide, metal salt of carboxylic acid, or chelate compound may be used. In the case of using the obtained aggregate of a metal oxide as a photosensitive electrode, titanium oxide, strontium titanate, or the like is preferable since such a metal oxide is stable without the problem of dissolution when irradiated with light. There are no particular limitations to the precursor insofar as it is soluble in the solvent to be used. Specific examples of the precursor include metal halides such as $TiCl_4$, $ZnCl_2$, $WCl_6$, $SnCl_2$, and $SrCl_6$; nitrates such as $Ti(NO_3)_4$, $Zn(NO_3)_2$, and $Sr(NO_3)_2$; carboxylates such as $V(CH_3COO)_2$, $Zn(CH_3COO)_2$, and $Sn(CH_3COO)_4$; and metal alkoxides represented by the general formula $M(OR)_n$ wherein M represents a metal element, R represents an alkyl group, and n denotes an oxidation number of the metal element represented by M. Given as examples of the metal alkoxide represented by the general formula $M(OR)_n$ are zinc diethoxide, tungsten hexaethoxide, vanadyl diethoxide, tin tetraisopropoxider and strontium diisopropoxide.

When forming a thin film of fine particles of a complex oxide such as strontium titanate, a double alkoxide containing two or more metals, which are components of the complex oxide, in the same molecule can be used. When forming a thin film of titanium oxide fine particles, titanium tetraisopropoxide, titanium tetranormalpropoxide, titanium tetraethoxide, titanium tetranormalbutoxide, titanium tetraisobutoxide, and titanium tetratertiarybutoxide can be used.

There are no limitations to the solvent used in the production o f the aggregate of metal oxide fine particles, an alcohol such as methanol, ethanol, isopropanol, or butanol is primarily used. Besides these solvents, a compound, such as formamide, dimethylformamide, dioxane, or benzene, in which the precursor of a metal oxide such as alkoxide can be dissolved and which never reacts with these precursor may be used without any problem.

The procedures and steps in the production method of the aggregate of metal oxide fine particles according to the present invention will be explained in detail. The contents of these explanations and this specification are described in detail in Japanese Patent Application No. 09-197074 (application date: Jun. 24, 1997). Some of the contents of the specification and drawings of said patent application are incorporated herein by reference in its entirety..

First, the precursor of a metal oxide (for example, a metal alkoxide) is added to a solvent (for example, an organic solvent such as alcohol). To the mixture are further added water required for partially hydrolyzing the precursor of a metal oxide and an acid such as hydrochloric acid, nitric acid, sulfuric acid, or acetic acid as a catalyst. The amounts of water and acid differ depending on the hydrolyzability of the precursor of a metal oxide and are not defined unconditionally. These may be optionally selected to the extent that the effect of the present invention is not impaired.

A mixed solution consisting of the precursor of a metal oxide, the solvent (for example, an organic solvent such as alcohol), water, and the catalyst (for example, an acid) is prepared by the above procedures.

In the present invention, the above step of preparing the mixed solution is sometimes referred to as the "mixed solution preparation step".

Next, the above mixed solution is refluxed at temperature between room temperature and 80° C. under a dry nitrogen atmosphere while being stirred. The reflux temperature and time also differ depending on the hydrolyzability of the precursor of a metal oxide and are not defined unconditionally. These may be optionally selected to the extent that the effect of the present invention is not impaired.

As a consequence of the refluxing, the precursor of a metal oxide is partially hydrolyzed. Specifically, in the metal alkoxide represented by the general formula $M(OR)_n$, only a part of the total —OR groups is hydrolyzed since water is contained in the mixed solution in such a small amount that an alkoxyl group cannot be sufficiently hydrolyzed when a metal alkoxide is used. As a consequence, the precursor is partially hydrolyzed. In the partially hydrolyzed precursor of a metal oxide, no condensation-polymerization reaction proceeds. Because of this, even if an —M—O—M— chain is formed partially, the precursor of a metal oxide is in the state of an oligomer. In this state, the mixed solution after the refluxing is transparent and a rise in the viscosity is not observed.

In the present invention, the above step of refluxing the mixed solution is sometimes referred to as the "reflux step".

Next, the temperature of the mixed solution after the refluxing is lowered to room temperature. A compound (preferably polyacrylic acid) interacting with the precursor of a metal oxide is then added to the mixed solution, whereupon the compound which is naturally insoluble in an organic solvent such as alcohol, easily dissolves in the mixed solution whereby a transparent sol containing at least the compound and the precursor of a metal oxide is prepared. The reason why the transparent sol is formed is because the compound and the precursor of a metal oxide are combined by a salt-formation reaction to form a polymer complex compound. This transparent sol is generally a colorless transparent and homogeneous solution. When polyamide acid is used as said compound, polyamide acid is combined with a metal alkoxide or metal chloride to form a polymer complex thereby forming a complex gel. In this case, after metal oxide fine particles are produced in the complex gel, the gel is dipped in an acetic anhydride/pyridine mixed solution to convert an amide acid structure into an imide ring structure thereby promoting re-solation.

In the present invention, the above step of preparing a transparent sol is sometimes referred to as the "transparent sol preparation step".

An excess amount of water is added to the transparent sol and the mixture is maintained at a temperature between room temperature and about 90° C. to continue the reaction further. As a consequence, the transparent sol is gelled between several minutes and about one hour thereby forming a complex gel with a cross-linking structure, the complex gel containing at least said compound and the precursor of a metal oxide.

In the present invention, the above step of preparing a complex gel is occasionally referred to as the "complex gel preparation step".

The above complex gel is maintained at a temperature between room temperature and about 90° C. (generally 80°

C.) for 5 to 50 hours to continue the reaction further. The complex gel is dissolved again thereby preparing a semi-transparent colloidal dispersion sol of metal oxide fine particles. This is because a hydrolysis reaction and condensation-polymerization reaction of the precursor of a metal oxide proceed and, at the same time, a salt structure consisting of said compound and the precursor of a metal oxide decomposes into metal oxide fine particles and carboxylate.

In the present invention, the above step of preparing a semitransparent colloidal dispersion sol of metal oxide fine particles is sometimes referred to as the "step of preparing a semitransparent colloidal dispersion sol of metal oxide fine particles".

The semitransparent colloidal dispersion sol of metal oxide fine particles prepared in the above manner is dried and/or sintered to obtain an aggregate of metal oxide fine particles.

The drying may be performed by air-drying or using a drier such as an oven. The drying temperature may be optionally selected according to the object. The drying yields an aggregate of metal oxide fine particles composed of aggregated metal oxide fine particles.

The sintering can be performed using, for example, a furnace. The sintering temperature differs depending on the types of metal oxide fine particles and is not defined unconditionally. It is generally about 400° C. or more. The above sintering ensures that crystallization of metal oxide fine particles and sintering among metal oxide fine particles proceed and that simultaneously a polymer phase is heat-decomposed to form metal oxide fine particles which are aggregated in a phase-separated condition.

When the colloidal dispersion sol of metal oxide fine particles is applied to a substrate and sintered, a substrate coated with a thin film of metal oxide fine particles can be easily obtained. This sintering ensures that the metal oxide fine particles are sintered with each other to form an aggregate of metal oxide fine particles.

In the present invention, the above step of drying and/or sintering is sometimes referred to as the "drying and sintering step".

Incidentally, in the present invention, the step of preparing a colloidal dispersion sol of metal oxide fine particles may be omitted and the above complex gel may be dried and sintered to prepare the aggregate of metal oxide fine particles.

There are no limitations to the configuration of the aggregate of metal oxide fine particles and the configuration of the aggregate can be optionally selected according to the object. For example, when the colloidal dispersion sol of metal oxide fine particles is made into particles, followed by drying, sintering, and the like, an aggregate of metal oxide fine particles with a configuration of secondary particles is obtained. On the other hand, when the colloidal dispersion sol of metal oxide fine particles is made into a thin film, followed by drying and sintering, a thin film of metal oxide fine particles can be obtained. Among these configurations, the thin film of the aggregate of metal oxide fine particles is particularly preferable in the present invention.

In order to prepare the thin film of the aggregate of metal oxide fine particles, it is necessary that the colloidal dispersion sol of metal oxide fine particles is made into a thin film prior to drying and sintering or that the aggregate of metal oxide fine particles prepared by the sintering is pulverized and dispersed in a mixed solution of an appropriate resin and an organic solvent and the dispersion is applied in a film-like form, followed by drying, sintering, and the like. A thin film of the colloidal dispersion sol of metal oxide fine particles can be formed, for example, by applying the colloidal dispersion sol of metal oxide fine particles to a substrate optionally selected or the like process.

The above application method is optionally selected from known coating methods such as a dip coating method, spin coating method, wire bar coating method, and spray coating method.

In the method of producing the aggregate of metal oxide fine particles according to the present invention, because the formation reaction of metal oxide fine particles proceeds in a complex gel in which the diffusion is regulated, bulky particles are not formed and no aggregation of sedimented particles occurs. A colloidal dispersion sol of metal oxide fine particles in which ultra-fine particles with a small grain size are uniformly dispersed can be thus obtained. In the steps of the hydrolysis reaction and dehydration/condensation reaction of the precursor of a metal oxide, a uniform phase with a substrate complex form is separated into a substrate phase and a metal oxide network phase, whereby an aggregate of metal oxide fine particles with a micro-phase separated structure is formed in an efficient manner.

In the present invention, the size of the individual metal oxide fine particles in the aggregate, the cycle of an aggregate structure of the metal oxide fine particles, and the volumetric ratio of an aggregate phase and a void phase can be controlled in desired ranges, for example, by selecting the mixing proportion of the compound interacting with the precursor of a metal oxide for the precursor of a metal oxide and the mixing proportion of a solid component consisting of the precursor of a metal oxide and the compound to the total mixed solution. Specifically, when the amount of the compound is increased, the volumetric ratio of the void phase in the resulting aggregate of metal oxide fine particles increases. When the proportion of a solid component consisting of the precursor of a metal oxide and the compound to the total mixed solution is decreased, the cycle of the aggregate structure of the resulting aggregate of metal oxide fine particles is small. The density of the void phase thereby increases but the size of the aggregate of metal oxide fine particles itself increases.

The preferred amount of the compound added to the precursor of a metal oxide differs depending on the proportion of the solid component in the total mixed solution and is not therefore defined unconditionally. Generally the ratio by weight of the compound is, however, preferably 0.1 to 1 and more preferably 0.2 to 0.8. When the ratio is less than 0.1, a large three-dimensional network of —M—O—M— grows and the complex gel is not thereby redissolved whereas when the ratio exceeds 1, relatively large voids are produced resulting in the formation of opaque particles and film of a metal oxide.

The preferred mixing proportion of the solid component for the total mixed solution differs depending on the proportion of the above compound for the precursor of a metal oxide and is not therefore defined unconditionally. The proportion is however generally 1 to 10% by weight and preferably 2 to 5% by weight. If the proportion is less than 1% by weight, the rate of the complex gel formation reaction is low, whereby metal oxide fine particles are formed in the transparent sol with high fluidity and as a result bulky fine particles are formed. When the proportion exceeds 10% by weight, then a homogeneous complex gel cannot always be obtained since the progression rate from the transparent sol to the complex gel is slow.

Next, the production of an aggregate of titanium oxide fine particles using titanium tetraisopropoxide according to an example of the preferred embodiment of the present invention will be explained.

First, titanium tetraisopropoxide is added to an alcohol to prepare a mixed solution. Here, water and an acid as a catalyst are added in advance to the above alcohol, wherein the proportions of water is preferably about 0.1 mol to an equivalent mol of titanium tetraisopropoxide, and the proportion of acid is preferably about 0.05 to 0.5 equivalent mol for titanium tetraisopropoxide.

Next, the mixed solution consisting of titanium tetraisopropoxide, alcohol, water, and acid is refluxed at a temperature between room temperature and 80° C. under a dry nitrogen atmosphere while being stirred. The reflux temperature and time in this case are preferably 80° C. and about 30 minutes to 3 hours respectively. As a result of the refluxing, a transparent mixed solution is obtained. In this mixed solution, titanium tetraisopropoxide is partially hydrolyzed to form an oligomer.

After this, the temperature of the mixed solution is dropped to room temperature. Polyacrylic acid is then added to the mixed solution, whereupon polyacrylic acid which is naturally insoluble in alcohol easily dissolves in the mixed solution whereby a transparent sol is prepared. This is because carboxyl groups of polyacrylic acid is combined with titanium tetraisopropoxide by a salt-formation reaction to form a substrate complex compound.

An excess amount of water is added to the transparent sol and the mixture is maintained at a temperature between room temperature and about 80° C. As a consequence, the transparent sol is gelled in several minutes to about one hour thereby forming a complex gel with a cross-linking structure, the complex gel containing at least polyacrylic acid and titanium tetraisopropoxide.

The above complex gel is maintained at about 80° C. for 5 to 50 hours. The complex gel dissolves again thereby preparing a semitransparent sol. This is because a hydrolysis reaction and condensation-polymerization reaction of titanium tetraisopropoxide proceed and, at the same time, a salt structure consisting of polyacrylic acid and titanium tetraisopropoxide decomposes into titanium oxide and a carboxylate.

The sol solution prepared in this manner is applied to an appropriate substrate by a dip coating method or the like and heated to about 400° C. or more, whereupon crystallization of titanium oxide fine particles and sintering between titanium oxide fine particles proceed and simultaneously a polymer phase is heat-decomposed to form an aggregate of titanium oxide fine particles (thin film) in which titanium oxide is aggregated in a phase separation condition.

The ratio by weight of polyacrylic acid to titanium tetraisopropoxide is preferably 0.3 to 0.7. When the ratio by weight is less than 0.3, a large three-dimensional network of —M—O—M— grows and a complex gel is not thereby dissolved whereas when the ratio exceeds 0.7, relatively large voids are produced resulting in the formation of an opaque film.

The preferred mixing proportion of the solid component consisting of titanium tetraisopropoxide and polyacrylic acid to the total mixed solution is 1 to 10% by weight. If the proportion is less than 1% by weight, the progression of the complex gel formation reaction is slow, whereby titanium oxide fine particles are formed in the sol with high fluidity and as a result bulky titanium oxide fine particles are formed. When the proportion exceeds 10% by weight, a homogeneous complex gel may not be obtained since the conversion progression from the transparent sol to the complex gel is rapid.

The method of producing the aggregate of metal oxide fine particles of the present invention ensures the preparation of an aggregate of metal oxide fine particles having a phase-separated structure comprising a phase in which the metal oxide fine particles are aggregated and a separated void phase containing no metal oxide fine particles. Because the aggregate of metal oxide fine particles itself maintains a configuration of secondary particles or a thin film, the phase in which the metal oxide fine particles are aggregated exhibits a continuous phase of a three-dimensionally continuous network. This type of structure ensures that in the aggregate of metal oxide fine particles, voids (micropores) with a small volume are produced between metal oxide fine particles and voids (macropores) with a volume larger than the former voids are produced between aggregate phases of metal oxide fine particles.

The aforementioned production method of the photosensitive semiconductor electrode is an effective means to obtain particularly the aggregate of metal oxide fine particles of the structure shown in the aforementioned FIG. 2. This method is also effective for the reasons that it is simple and imparts high processability to the aggregate even if the aggregate of metal oxide fine particles in which metal oxide fine particles are densely deposited and which have no macropores is produced.

Photosensitive Semiconductor Electrode

A photosensitive semiconductor electrode according to the present invention comprises a substrate and thereon a metal oxide porous body, the porous body having a plurality of peaks in the size frequency distribution of the fine pores. In particular, preferably at least one peak among the plurality of peaks is that corresponding to the range of a macropore and at least one peak among the plurality of peaks is that corresponding to the range of a micropore. The aforementioned aggregate of metal oxide fine particles and the aggregate of metal oxide fine particles produced by the aforementioned method according to the present invention are preferable as this metal oxide porous body. Incidentally, the words "macropore", "micropore", "peak", and the like herein are the same as used for the explanations of the aforementioned aggregate of metal oxide fine particles.

The effect of the metal oxide porous body comprising the photosensitive semiconductor electrode, specifically the effect of the presence of a plurality of peaks in the pore size frequency distribution of the fine pores will be explained. When a photosensitive semiconductor electrode is used as an electrode for an electrochemical equipment or as a sensor making use of a change in the properties of a material adhered to the surface of a photosensitive semiconductor electrode, a chemical or physical phenomenon occurs at the interface of the photosensitive semiconductor electrode. In order that the photosensitive semiconductor electrode exhibits efficient function of converting light energy into electrical energy, it is effective to increase the photoelectric specific surface area of the photosensitive semiconductor electrode to make a large interface. The specific surface area can be increased by providing the photosensitive semiconductor electrode with micropores at high density. However even the largest specific surface area can only impart a small effect if functional molecules such as a sensitizing dye which are added so as to improve the energy conversion effect cannot penetrate into every nook of the interface inside the photosensitive semiconductor electrode.

In the present invention, the diffusion of a material in the metal oxide porous body is assigned to the macropores and the securance of the specific surface area is assigned to the micropores, thereby solving the aforementioned problem.

When the porous structure of the metal oxide porous body is likened to a highway system, the macropore and the micropore correspond to an arterial highway and an alley in a residential area respectively. Specifically, the transport volume (movement) between distant places is governed by the high ways and an access to intricate places is governed by the alleys. The use of the metal oxide porous body with the micropores and macropores as the photosensitive semiconductor electrode makes it possible to attain an increase in the specific surface area and an excellent diffusion of a material at the same time.

When such a photosensitive semiconductor electrode formed from a metal oxide porous body is used as the aforementioned sensitizing dye absoption-type photosensitive electrode, the electrode is not immediately saturated with the sensitizing dye quantitatively even if the film thickness is increased. A sufficient amount of the sensitizing dye can be adsorbed. A photocell having a high energy conversion efficiency can be realized and the prior art problems are thus solved. When such a photosensitive semiconductor electrode formed from the metal oxide porous body is used as the aforementioned sensor device as aforementioned, a sensor which is highly sensitive in spite of its small size can be obtained since the sensing area is large.

The structure of the metal oxide porous body constituting the present invention may be, besides the aforementioned structure formed from the aggregate of fine particles, an arborescent structure, blood vessel-like structure, or a fractal structure. Namely, any structure of the metal oxide porous body in which the micropores and macropores exist and share the aforementioned roles may be used.

When the photosensitive semiconductor electrode formed from the metal oxide porous body having such a structure is used as a photocell, the efficiency of the light utilization and the efficiency of the oxidation reduction reaction are improved and a photocell having a high conversion efficiency is thus provided. The effect is greatly increased especially by a so-called sensitizing dye-type photocell having a structure in which a dye is adsorbed into a photosensitive semiconductor electrode.

Though no particular limitations are imposed on the metal oxide used in the present invention, titanium oxide, zinc oxide, tungsten oxide, vanadium oxide, tin oxide, copper oxide, and strontium oxide are exemplified. Among these, as the photosensitive electrode, titanium oxide, strontium titanate, or the like is preferably used because these compounds are stable and free from the problem of dissolution when irradiated with light.

Plates, rods, or spheres of transparent conductive glasses such as ITO glass and NESA glass and metals such as iron and its alloys, titanium, nickel, silver, and copper may be used as the substrate for the photosensitive semiconductor electrode of the present invention according to the object.

Method of Manufacturing the Photosensitive Semiconductor Electrode

The arborescent structure, blood vessel-like structure, or fractal structure of the metal oxide porous body can be realized by a method of chemically etching a non-porous film, electrochemically etching in the same manner as in the anode oxidation, or making use of a phase separation phenomenon.

In addition, when the metal oxide porous body is the aggregate of metal oxide fine particles, a photosensitive semiconductor electrode can be manufactured with ease by utilizing the aforementioned production method of the aggregate of metal oxide fine particles. Incidentally, the method of producing the photosensitive semiconductor electrode is explained in the specification and drawings of Japanese Patent Application No. 09-304615. The disclosure of the Japanese application is incorporated herein by reference in its entirety.

Functional Molecule

The photosensitive semiconductor electrode of the present invention provided with the metal oxide porous body on the surface thereof and the metal oxide porous body in which there are both the micropores and the macropores as aforementioned. Various functional molecules are therefore allowed to effectively penetrate deep into the inside of the porous body and can be carried by the porous body. As examples of the functional molecule, sensitizing dyes, various catalysts, and various enzymes are given.

When the functional molecule is a sensitizing dye and the metal oxide porous body has photosensitive responsiveness, the resulting photosensitive semiconductor electrode is used as a photosensitive semiconductor electrode (which has the same meanings as "photosensitive electrode") for generating photovoltaic force in a highly efficient manner. In this case, among the sensitizing dyes, a visible light-sensitizing dye is especially preferable, as the resulting photosensitive electrode efficiently absorbs solar light effectively and efficiently to generate high photovoltaic force.

Examples of the sensitizing dye, any sensitizing dye having a sensitizing action may be used in the present invention, include xanthene-type dyes such as Rhodamine B, Rose Bengale, Eosin, and Erythrocin; cyanine-type dyes such as quinocyanine and cryptocyanine; basic dyes such as phenosafranine, thiocyne, and Methylene Blue; porphyrin-type compounds such as chlorophyll, zinc porphyrin, and magnesium porphyrin; azo dyes, phthalocyanine compounds, complex compounds such as Ru trisbipyridyl, anthraquinone-type dyes, and polycyclicquinone-type dyes.

Incidentally, in the aforementioned phrase "the metal oxide porous body has photosensitive responsiveness", the porous body indicates those composed of metal oxides which absorb light with an energy larger than the bandgap energy to generate a carrier.

The amount of the sensitizing dye adsorbed by the metal oxide porous body differs depending on the structure of the fine pores and the film thickness of the metal oxide porous body, the size of the sensitizing dye molecules, and the required qualities. The metal oxide porous body in the photosensitive semiconductor electrode of the present invention, however, has a higher adsorption saturation point than conventional electrodes and can improve the performance of the resulting photosensitive electrode.

The adsorption of the sensitizing dye by the metal oxide porous body can be attained by a method in which the sensitizing dye is dissolved or dispersed in an appropriate solvent and a photosensitive semiconductor electrode formed with the metal oxide porous body is dipped in the resulting dissolved or dispersed solution. Other than this method, a method in which the sensitizing dye is vaporized in vacuum and is adsorbed by a substrate in a vapor phase may be adopted.

Structure of the Photocell

Figure 3:
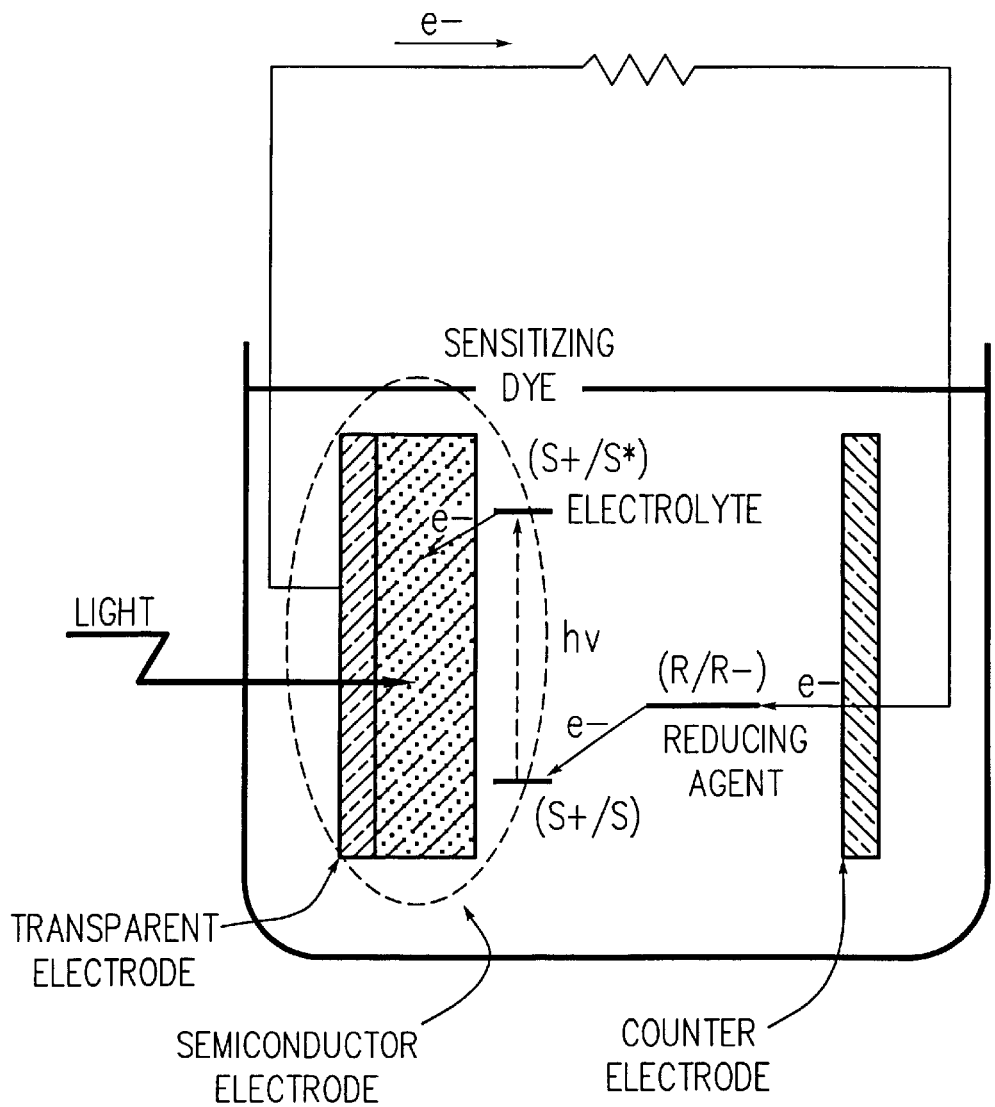
FIG. 3 is a typical side elevational view showing an example of a wet photochemical cell of an embodiment of a photoelectric converter according to the present invention.

No particular structural limitations are imposed on the photocell of the present invention insofar as the aforementioned photosensitive semiconductor electrode is used as the photosensitive electrode and various structures may be adopted. As a typical example, a so-called wet photochemical cell (photoelectrochemical energy conversion equipment) in which the photosensitive semiconductor electrode (photosensitive electrode) is connected to the counter electrode via an electrolytic solution can be given. The structure is shown in FIG. 3.

Any conductive material may be used as the counter electrode, and preferable examples of the counter electrode include platinum, palladium, rhodium, and ruthenium which have reduced the overpotential for an oxidation reduction reaction. As the solvent for the electrolytic solution, water or a polar solvent such as acetonitrile, pyridine, dimethylacetamide, propylene carbonate, and ethylene carbonate, or a mixture of these solvents may be used. The electrolytic solution contains at least a material (a reduction-system) which can reversely cause the change of oxidation/reduction states. Examples of the reduction-system include an iodide ion/iodine, bromide ion/bromine, quinone/hydroquinone, iron (II) ion/iron (III) ion, and copper (I) ion/copper (II) ion. Furthermore, a supporting electrolytes may be added to the electrolytic solution to increase the electroconductivity of the electrolytic solution. Examples of the supporting electrolyte include calcium chloride, sodium sulfate, and ammonium chloride.

EXAMPLES

The present invention will be illustrated in more detail by way of examples, which, however, shall not be construed as limiting the invention. It is also understood that various changes and modifications may be made based on known technologies of a person skilled in the art without departing from the spirit and scope of the invention.

Example 1

6.41 g of titanium tetraisopropoxide was diluted in 20 ml of ethanol, to which were added 0.514 g of nitric acid with a specific gravity of 1.38 and 0.2 ml of water while stirring. The above mixing procedure was carried out under a dry nitrogen atmosphere. The mixed solution was heated to 80° C. and refluxed under a dry nitrogen atmosphere for 2 hours to prepare a colorless transparent sol solution. The sol solution was cooled to room temperature. 0.1 g of polyacrylic acid was added to 2 g of the cooled sol solution while stirring. As a consequence, the polyacrylic acid was completely dissolved and a colorless transparent sol solution was thus prepared.

2 ml of water was added to the resulting sol solution to prepare a colorless transparent and homogeneous sol solution. The sol solution was sealed in a glass container and heated to 80° C. The sol solution was gelled in about 5 minutes and an almost transparent and homogeneous complex gel was thus produced. When the complex gel was further maintained at 80° C. for about 15 hours, the gel dissolved again thereby preparing a slightly white, semi-transparent colloidal dispersion sol solution A of titanium oxide fine particles.

The sol solution A was applied to the surface of a quartz substrate using a spin coating method, heated to 450° C. and maintained for 20 minutes so as to sinter thereby forming a colorless transparent film. These application and sintering steps were repeated to obtain a photosensitive semiconductor electrode wherein films with different film thicknesses were formed on the substrate.

The crystal structures of the films of the resulting photosensitive semiconductor electrode were measured by X-ray diffraction. As a result, it was confirmed that an anatase-type titanium oxide was formed. Observation of the fine structure of the film by SEM showed that a phase-separated aggregate structure of fine particles was formed. The void between aggregate phases of fine particles had a width of about 200 to 500 Å and a length of about 500 to 2,000 Å. Observation of the finer structure of the aggregate phase by TEM showed that, in this aggregate phase, fine particles with a diameter of about 100 Å were aggregated. Also, it was confirmed by electron beam diffraction that these fine particles were anatase-type titanium oxide.

Figure 4:
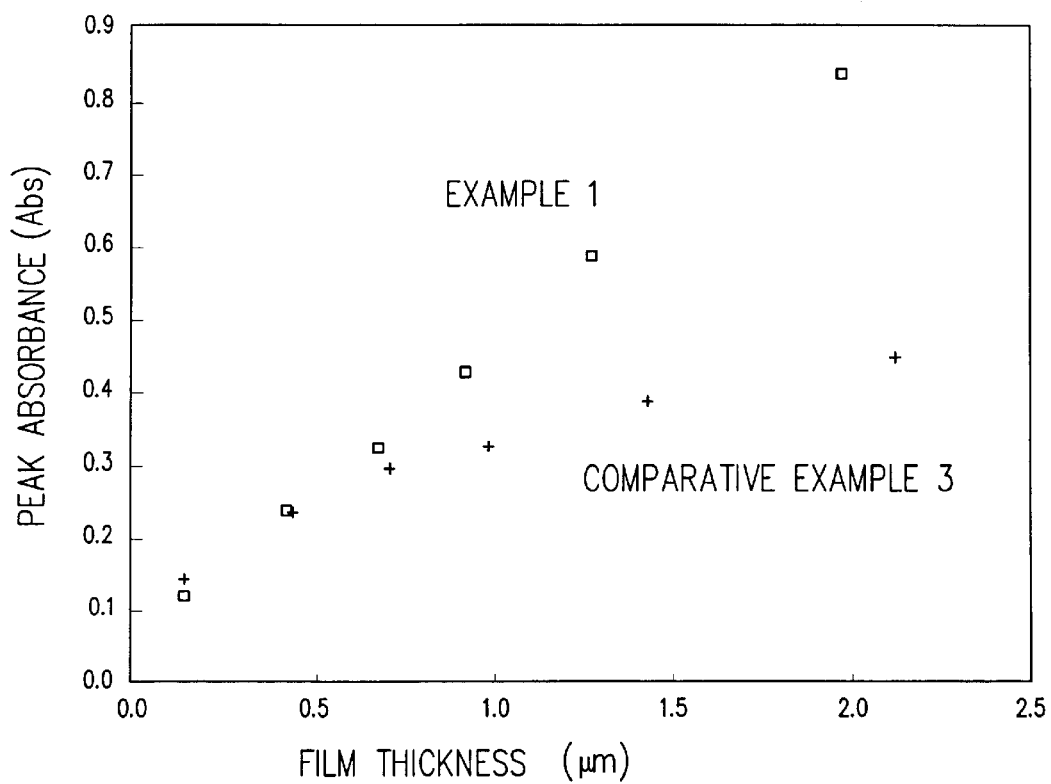
FIG. 4 is a graph showing the absorption spectrum absorbances of the photosensitive semiconductor electrodes prepared in Example 1 and Comparative Example 3 as a function of a thin film thickness.

The resulting photosensitive semiconductor electrode was dipped in an ethanol solution (concentration: $10^{-3}$ mol/l) of the Ru complex represented by the structural formula (1) illustrated below to perform adsorption treatment of a sensitizing dye thereby preparing a photosensitive electrode was obtained. FIG. 4 shows the relationship between the absorbance of the peak of an absorption spectrum and the thickness of a film on the substrate.

Structural formula (1)

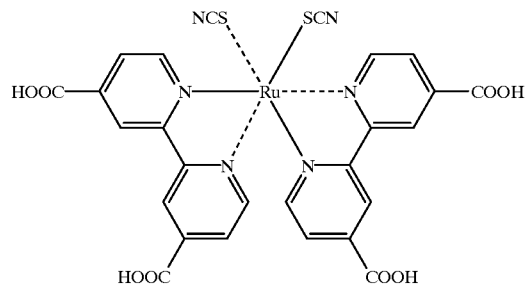

Figure 5:
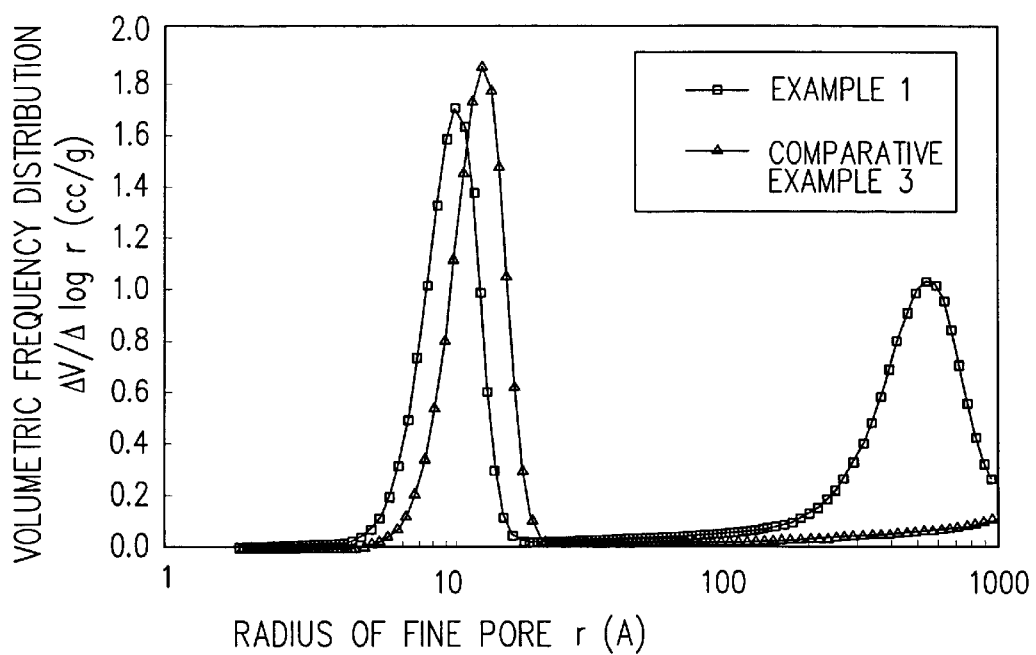
FIG. 5 is a graph showing the pore size frequency distributions of the fine pores of the thin films of the photosensitive semiconductor electrodes prepared in Example 1 and Comparative Example 3.

The aforementioned sol solution A was applied to the surface of an aluminum sheet using a dip coating method and heated to 50° C. and maintained for 20 minutes so as to sinter thereby forming a colorless transparent film. These application and sintering steps were repeated 15 times to form a film with a thickness of 1.95 μm. The resulting aluminum sheet was cut into strips to measure the size frequency distribution of the fine pores in the film using a gas adsorption method (krypton was used as an adsorbent gas) according to a constant-volume method. The results are shown in FIG. 5. As is clear from FIG. 5, the resulting film had two pore size frequency distributions, namely micropores with a radius of 50 Å or less and macropores with a radius of about 500 Å.

The aforementioned sol solution A was applied to the surface of an ITO substrate using a spin coating method and heated to 450° C. and maintained for 20 minutes so as to sinter thereby forming a colorless transparent thin film. These application and sintering steps were repeated to obtain a photosensitive semiconductor electrode wherein films with different film thicknesses were formed on the substrate. The resulting photosensitive semiconductor electrode was dipped in an ethanol solution (concentration: $10^{-3}$ mol/l) of the Ru complex represented by the structural formula (1) to perform adsorption treatment of a sensitizing dye thereby preparing a photosensitive electrode.

Figure 6:
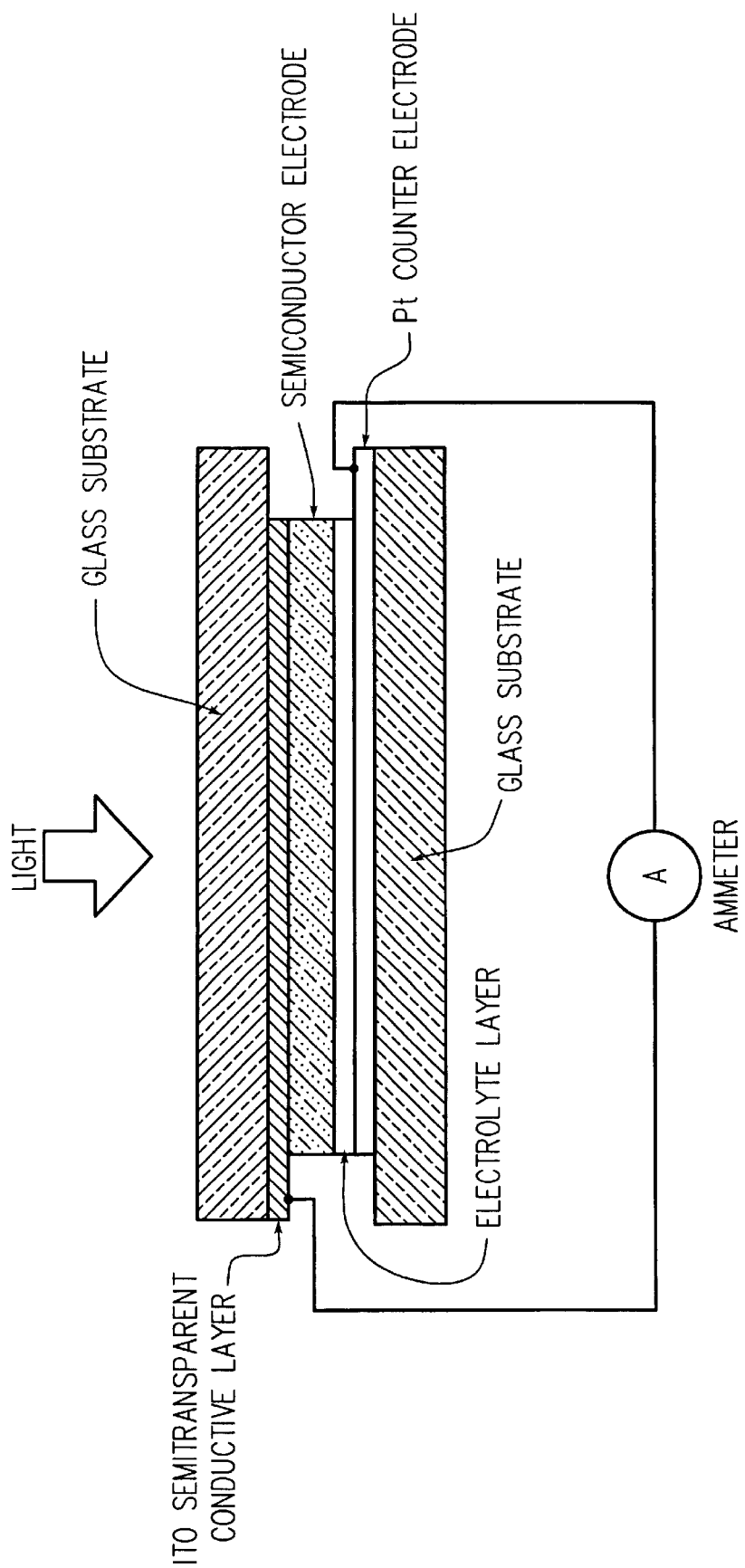
FIG. 6 is a schematic view of the structure of the photocell prepared in Example 1.

This photosensitive electrode was adhered to ITO glass coated with a platinum thin film layer as the counter electrode. The flak was sealed using an epoxy adhesive except for one part which was left open. An electrolyte was infused in the clearance between the two sheets by making use of capillary action to produce a photocell as shown in FIG. 6. The electrolyte was prepared by dissolving 1.44 g of tetrapropyl iodide and 0.076 g of iodine in 10 ml of a mixed solution of ethylene carbonate and acetonitrile (at a volumetric ratio of 4:1 respectively).

Figure 7:
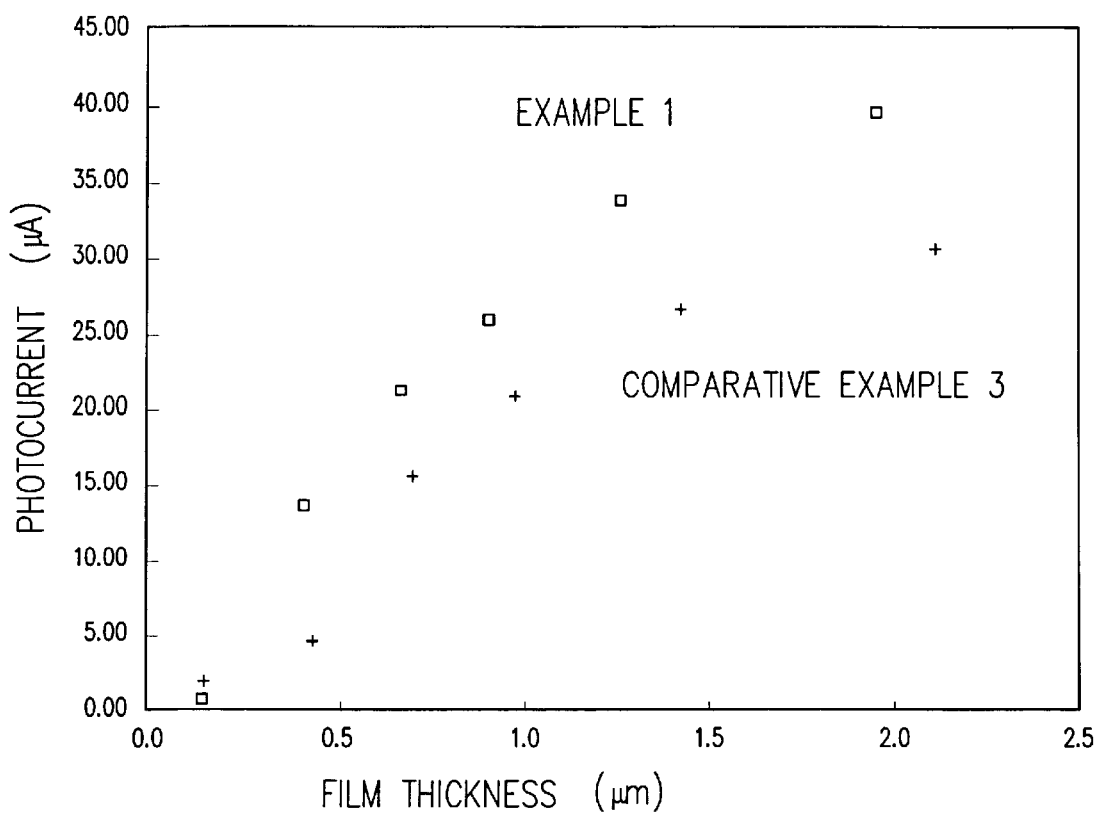
FIG. 7 is a graph showing the photovoltaic currents of the photosensitive semiconductor electrodes prepared in Example 1 and Comparative Example 3 as function of a thickness of a thin film.

The photosensitive semiconductor electrode was irradiated with monochromatic light (a wave length of 530 nm) at an illumination of 500 $\mu W/cm^2$ while a short-circuit current (photovoltaic current) flowing between the photosensitive semiconductor electrode and the counter electrode was measured. FIG. 7 shows the relationship between film thickness and photovoltaic current.

Comparative Example 1

6.41 g of titanium tetraisopropoxide was diluted in 20 ml of ethanol, to which were added 0.514 g of nitric acid with a specific gravity of 1.38 and 0.2 ml of water while stirring. The above mixing procedure was carried out under a dry nitrogen atmosphere. The mixed solution was heated to 80° C. and refluxed under a dry nitrogen atmosphere for 2 hours to prepare a colorless transparent sol solution. The sol solution was cooled to room temperature. 2 ml of water was added to 2 g of the cooled sol solution to prepare a colorless transparent and homogeneous sol solution.

The sol solution was sealed in a glass container and heated to 80° C. The sol solution was gelled for about one hour and a slightly turbid and homogeneous gel was thus produced. When the gel was further maintained at 80° C. for about 50 hours, the gel did not dissolve but instead gradually shrunk and the volume of the gel finally reduced to approximately ¼ of the initial volume.

Comparative Example 2

6.41 g of titanium tetraisopropoxide was diluted in 20 ml of ethanol, to which were added 0.514 g of nitric acid with a specific gravity of 1.38 and 0.2 ml of water while stirring. The above mixing procedure was carried out under a dry nitrogen atmosphere.

The mixed solution was heated to 80° C. and refluxed under a dry nitrogen atmosphere for 2 hours to prepare a colorless transparent sol solution. The sol solution was applied to the surface of a glass substrate using a spin coating method, heated to 450° C. and maintained for 20 minutes so as to sinter thereby forming a photosensitive semiconductor electrode on which a colorless transparent film (a film thickness of 1.50 $\mu m$) was formed.

Observation of the fine structure of the film of the resulting photosensitive semiconductor electrode by SEM showed that no clear texture was observed and the electrode had a uniform and densified structure. Observation of the finer structure of the electrode by TEM showed that no clear phase separation structure was observed.

The resulting photosensitive semiconductor electrode was dipped in an ethanol solution (concentration: $10^{-3}$ mol/l) of the Ru complex represented by the above structural formula (1) to perform adsorption treatment of a sensitizing dye. However, no adsorption of the sensitizing dye was observed.

Comparative Example 3

25 g of titanium tetraisopropoxide was added to a mixed solution of 1.544 g of nitric acid with a specific gravity of 1.38 and 150 ml of water while vigorously stirring. The above mixing procedure was carried out under a dry nitrogen atmosphere. The mixed solution was heated to 80° C. and refluxed under a dry nitrogen atmosphere for 8 hours to prepare a semitransparent sol solution. 2.0 g of polyethylene glycol monooctyl phenyl ether was then added to the sol solution.

The sol solution was applied to the surface of a glass substrate using a spin coating method, heated to 450° C. and maintained for 20 minutes so as to sinter thereby forming a colorless transparent film. These application and sintering steps were repeated to obtain a photosensitive semiconductor electrode wherein films with different film thicknesses were formed on the substrate.

Observation of the fine structure of the film of the resulting photosensitive semiconductor electrode by SEM showed that no clear texture was observed and the electrode had a uniform and densified structure. Observation of the finer structure of the electrode by TEM showed that the film was structured from fine particles with a diameter of 20 nm.

The resulting photosensitive semiconductor electrode was dipped in an ethanol solution (concentration: $10^{-3}$ mol/l) of the Ru complex represented by the above structural formula (1) to perform adsorption treatment of a sensitizing dye. FIG. 4 shows the relation of thickness vs. absorbance of the peak of an absorption spectrum. It is clear from the figure that the absorbance tends to become saturated as the thickness increases and the absolute value of the absorbance is lower than that of Example 1, exhibiting inferior dye-adsorbing capability.

The size frequency distribution of the fine pores of a porous film was measured in the same manner as in Example 1. The result is shown in FIG. 5. As is clear from FIG. 5, only micropores with a grain size of 50 Å or less were observed, which differed from the result obtained in Example 1.

In addition, a photocell was produced in the same manner as in Example 1 to measure the photovoltaic current. FIG. 7 shows the relation of photovoltaic current vs. film thickness. As is clear from FIG. 7, the photovoltaic current was lower than that of Example 1, showing that this photocell had inferior characteristics.

Example 2

A photosensitive electrode formed of a titanium oxide porous film (film thickness: 2.50 $\mu m$) was produced in the same manner as in Example 1 except that the adsorption treatment of a sensitizing dye was not performed and a photocell was then manufactured in the same manner as in Example 1. The photocell electrode was irradiated with monochromatic light (a wave length of 350 nm) at an illumination of 300 $\mu W/cm^2$ while a short-circuit current (photovoltaic current) flowing between the photosensitive electrode and the counter electrode was measured. The photovoltaic current was 26 $\mu A/cm^2$.

Comparative Example 4

A photosensitive semiconductor electrode formed of a titanium oxide porous film (film thickness: 2.34 $\mu m$) was produced in the same manner as in Comparative Example 3 except that the adsorption treatment of a sensitizing dye was not performed and a photocell was then manufactured in the same manner as in Example 1. The photocell electrode was irradiated with monochromatic light (a wave length of 350 nm) at an illumination of 300 $\mu W/cm^2$ while a short-circuit current (photovoltaic current) flowing between the photosensitive electrode and the counter electrode was measured. The photovoltaic current was 9.8 $\mu A/cm^2$. The photovoltaic current was lower than that of Example 2, showing that this photocell had inferior characteristics.

Example 3

11.36 g of tungsten hexaethoxide was diluted in 20 ml of ethanol, to which were added 0.514 g of nitric acid with a specific gravity of 1.38 and 0.2 ml of water while stirring. The above mixing procedure was carried out under a dry nitrogen atmosphere. The mixed solution was heated to 80°

C. and refluxed under a dry nitrogen atmosphere for 2 hours to prepare a colorless transparent sol solution.

The sol solution was cooled to room temperature. 0.1 g of polyacrylic acid was added to 2 g of the cooled sol solution while stirring. As a consequence, the polyacrylic acid was completely dissolved and a colorless transparent sol solution was thus prepared.

2 ml of water was added to the resulting sol solution to prepare a colorless transparent and uniform sol solution. The sol solution was sealed in a glass container and heated to 80° C. The sol solution was gelled for about 20 minutes and an almost transparent and uniform complex gel was thus produced. When the complex gel was further maintained at 80° C. for about 20 hours, the gel dissolved again thereby preparing a slightly white and semitransparent colloidal dispersion sol solution of titanium oxide fine particles.

The sol solution was applied to the surface of an ITO substrate using a spin coating method, heated to 450° C. and maintained for 20 minutes to sinter thereby obtaining a photosensitive semiconductor electrode on which a colorless transparent film (film thickness: 1.40 $\mu$m) was formed.

Observation of the fine structure of the film of the resulting photosensitive semiconductor electrode by SEM showed that a phase-separated aggregate structure of fine particles was formed. Observation of the finer structure of the aggregate phase by TEM showed that, in this aggregate phase, fine particles with a diameter of about 150 Å were aggregated.

The pore size frequency distribution of fine pores of the film was measured in the same manner as in Example 1. The presence of micropores with a radius of 100 Å or less and macropores with a radius of 1,000 Å or more was confirmed.

The resulting photosensitive semiconductor electrode was dipped in an ethanol solution (concentration: $10^{-3}$ mol/l) of the Ru complex represented by the above structural formula (1) to perform adsorption treatment of a sensitizing dye. Furthermore, a photocell was manufactured in the same manner as in Example 1.

The photocell was irradiated with monochromatic light (a wave length of 530 nm) at an illumination of 300 $\mu$W/cm$^2$ while a short-circuit current flowing between the photosensitive semiconductor electrode and the counter electrode was measured. The photovoltaic current was 15.0 $\mu$A/cm$^2$.

11.36 g of tungsten hexaethoxide was diluted in 20 ml of ethanol, to which were added 1.544 g of nitric acid with a specific gravity of 1.38 and 0.2 ml of water while stirring. The above mixing procedure was carried out under a dry nitrogen atmosphere. The mixed solution was heated to 80° C. and refluxed under a dry nitrogen atmosphere for 2 hours to prepare a colorless transparent sol solution.

The sol solution was applied to the surface of a glass substrate using a spin coating method, heated to 450° C. and maintained for 20 minutes so as to sinter thereby forming a photosensitive semiconductor electrode wherein a colorless transparent film (a film thickness of 1.70 $\mu$m) was formed on the substrate.

Observation of the fine structure of the film of the resulting photosensitive semiconductor electrode by SEM showed that no clear texture was observed and the electrode had a uniform and densified structure. Observation of the finer structure of the electrode by TEM showed that no clear phase separation structure was observed.

The resulting photosensitive semiconductor electrode was dipped in an ethanol solution (concentration: $10^{-3}$ mol/l) of the Ru complex represented by the above structural formula (1) to perform adsorption treatment of a sensitizing dye. However, no adsorption of the sensitizing dye was observed.

Comparative Example 6

25 g of tungsten hexaethoxide was added to a mixed solution of 1.544 g of nitric acid with a specific gravity of 1.38 and 150 ml of water while vigorously stirring. The above mixing procedure was carried out under a dry nitrogen atmosphere. The mixed solution was heated to 80° C. and refluxed under a dry nitrogen atmosphere for 8 hours to prepare a semitransparent sol solution. 2.0 g of polyethylene glycol monooctyl phenyl ether was then added to the sol solution.

The sol solution was applied to the surface of a glass substrate using a spin coating method and heated to 450° C. and maintained for 20 minutes to sinter thereby forming a photosensitive semiconductor electrode wherein a colorless transparent film (film thickness: 1.70 $\mu$m) was formed on the substrate.

Observation of the fine structure of the film of the resulting photosensitive semiconductor electrode by SEM showed that no clear texture was observed and the electrode had a uniform and densified structure. Observation of the finer structure of the electrode by TEM showed that the film was structured from fine particles with a diameter of 20 nm.

The resulting photosensitive semiconductor electrode was dipped in an ethanol solution (concentration: $10^{-3}$ mol/l) of the Ru complex represented by the above structural formula (1) to perform adsorption treatment of a sensitizing dye. In addition, a photocell was produced in the same manner as in Example 1.

The photocell was irradiated with monochromatic light (a wave length of 530 nm) at an illumination of 300 $\mu$W/cm$^2$ while a short-circuit current (photovoltaic current) flowing between the photosensitive electrode and the counter electrode was measured. The photovoltaic current was 8.7 $\mu$A/cm$^2$. The photovoltaic current is lower than that of Example 3, showing that this photocell has inferior characteristics.

Example 4

(Synthesis of the Polymer Compound)

10.28 g of 2,2-bis[4-(4-aminophenoxy)phenyl] hexafluoropropane represented by the structural formula (2) shown below was dissolved in 200 ml of dimethylacetamide under a dry nitrogen atmosphere. After perfect dissolution, 8.88 g of 4,4'-(hexafluoroisopropylidene)phthalic acid anhydride represented by the structural formula (3) shown below was gradually added to the mixture. Subsequently, the resulting mixture was slowly stirred under a dry nitrogen atmosphere for one hour while it was maintained at 10 to 15° C. and was further agitated for 2 hours while it was maintained at 20 to 25° C. to obtain a solution of a polymer compound represented by the structural formula (4) shown below.

Structural formula (2)

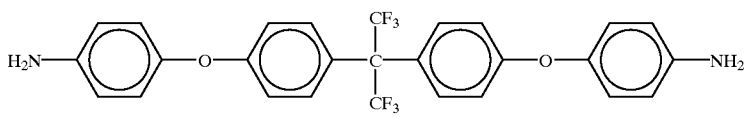

Structural formula (3)

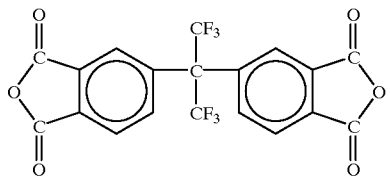

Structural formula (4)

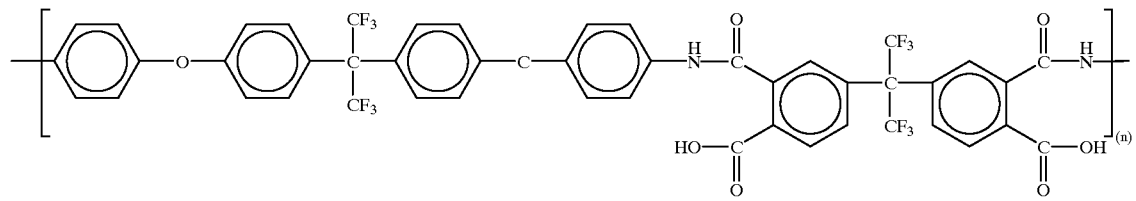

(In the formula, n is about 300.)

(Formation of an Aggregate of Titanium Oxide Fine Particles)

6.41 g of titanium tetraisopropoxide was diluted in 20 ml of dimethylacetamide, to which were added 0.514 g of nitric acid with a specific gravity of 1.38 and 0.2 ml of water while stirring. The above mixing procedure was carried out under a dry nitrogen atmosphere. The mixed solution was heated to 80° C. and refluxed under a dry nitrogen atmosphere for 2 hours to prepare a colorless transparent sol solution. The sol solution was cooled to room temperature. 2 g of polyacrylic acid solution of the polymer compound represented by the above structural formula (4) was added to 2 g of the cooled sol solution while stirring. As a consequence, the polyacrylic acid was completely dissolved and a colorless transparent sol solution was thus prepared.

2 ml of water was added to the resulting sol solution to prepare a colorless transparent and uniform sol solution. The sol solution was sealed in a glass container and heated to 80° C. The sol solution was gelled in about 5 minutes and an almost transparent and uniform complex gel was thus produced. When the complex gel was further maintained at 80° C. for about 15 hours, a slightly white and semitransparent colloidal dispersion gel solution of titanium oxide fine particles was produced. The gel was collected and dipped in 5 ml of a mixed solution of acetic anhydride/pyridine (ratio by volume: 1:1). The mixed solution was maintained at 50° C. for 5 hours to prepare a slightly white and semitransparent colloidal dispersion sol solution of titanium oxide fine particles.

The sol solution was applied to the surface of an ITO substrate using a spin coating method, heated to 450° C. and maintained for 20 minutes to sinter thereby forming a photosensitive semiconductor electrode wherein a colorless transparent film (film thickness: 1.50 μm) was formed on the substrate.

The crystal structure of the film of the resulting photosensitive semiconductor electrode was measured by X-ray diffraction. As a result, it was confirmed that an anatase-type titanium oxide was formed. Observation of the fine structure of the film by SEM showed that a phase-separated aggregate structure was formed. The void between aggregate phases of fine particles had a width of about 200 to 700 Å and a length of about 500 to 2,000 Å. Observation of the finer structure of the aggregate phase by TEM showed that, in this aggregate phase, fine particles with a diameter of about 150 Å were aggregated. Also, it was confirmed by electron beam diffraction that these fine particles were anatase-type titanium oxide.

The resulting photosensitive semiconductor electrode was dipped in an ethanol solution (concentration: $10^{-3}$ mol/l) of the Ru complex represented by the above structural formula (1) to perform adsorption treatment of a sensitizing dye. Furthermore, a photocell was manufactured in the same manner as in Example 1.

The photocell was irradiated with monochromatic light (a wave length of 530 nm) at an illumination of 300 $\mu$W/cm$^2$ while a short-circuit current (photovoltaic current) flowing between the photosensitive semiconductor electrode and the counter electrode was measured. The photovoltaic current was 29.2 $\mu$A/cm$^2$.

Table 1 shows the results of the film thickness, number of operations of application/sintering, peak absorbance, excited light wavelength, and generated photovoltaic current of the photosensitive semiconductor electrodes prepared in Examples 1 to 4 and Comparative Examples 1 to 6.

TABLE 1

| | Number of application and sintering operation (times) | Film thickness (μm) | Peak absorbance (Abs) | Exited light wavelength (nm) | Photovoltaic current (μA/cm$^2$) |
|---|---|---|---|---|---|
| Example 1 | 1 | 0.14 | 0.12 | 530 | 0.58 |
| | 3 | 0.41 | 0.23 | 530 | 13.27 |
| | 5 | 0.67 | 0.32 | 530 | 20.73 |
| | 7 | 0.91 | 0.42 | 530 | 25.43 |
| | 10 | 1.26 | 0.58 | 530 | 33.28 |
| | 15 | 1.95 | 0.83 | 530 | 39.17 |
| Comparative example 1 | No film could be formed | — | — | — | — |

TABLE 1-continued

| | Number of application and sintering operation (times) | Film thickness ($\mu$m) | Peak absorbance (Abs) | Exited light wavelength (nm) | Photovoltaic current ($\mu$A/cm$^2$) |
|---|---|---|---|---|---|
| Comparative example 2 | 30 | 1.50 | 0.02 | — | — |
| Comparative example 3 | 1 | 0.14 | 0.16 | 530 | 1.71 |
| | 3 | 0.43 | 0.21 | 530 | 4.38 |
| | 5 | 0.70 | 0.25 | 530 | 15.30 |
| | 7 | 0.98 | 0.29 | 530 | 20.47 |
| | 10 | 1.42 | 0.32 | 530 | 26.10 |
| | 15 | 2.11 | 0.37 | 530 | 30.16 |
| Example 2 | 20 | 2.50 | 1.50 | 350 | 26.0 |
| Comparative example 4 | 40 | 2.34 | 1.23 | 350 | 9.8 |
| Example 3 | 15 | 1.40 | 0.58 | 530 | 15.0 |
| Comparative example 5 | 20 | 1.70 | 0.01 | — | — |
| Comparative example 6 | 15 | 1.70 | 0.28 | 530 | 8.7 |
| Example 4 | 15 | 1.50 | 0.56 | 530 | 29.2 |

Example 5

The colloidal dispersion sol solution A of titanium oxide fine particles prepared in Example 1 was applied to the surface of an ITO substrate using a spin coating method to prepare a thin film with a film thickness of 0.7 $\mu$m. The thin film was heated to 450° C. and maintained for 20 minutes to sinter thereby forming a colorless transparent thin film. The resulting photosensitive semiconductor electrode prepared in this manner was dipped in an ethanol solution (concentration: $10^{-3}$ mol/l) of the Ru complex represented by the structural formula (5) illustrated below to perform adsorption treatment of a sensitizing dye. This photosensitive semiconductor electrode was applied to ITO glass formed with a platinum thin film layer as the counter electrode. The peripheral end was sealed using an epoxy adhesive except for one part which was left open. An electrolyte was infused in the clearance between the two sheets by making use of capillary action to manufacture a photocell as shown in FIG. 6. The electrolyte was prepared by dissolving 1.44 g of tetrapropyl iodide and 0.076 g of iodine in 10 ml of a mixed solution of ethylene carbonate and acetonitrile (at a volumetric ratio of 4:1 respectively).

The photosensitive semiconductor electrode was irradiated with monochromatic light (a wave length of 530 nm) at an illumination of 300 $\mu$W/cm$^2$ while a short-circuit current (photovoltaic current) flowing between the photosensitive semiconductor electrode and the counter electrode was measured. The photovoltaic current was 13.4 $\mu$A/cm$^2$.

Structural formula (5)

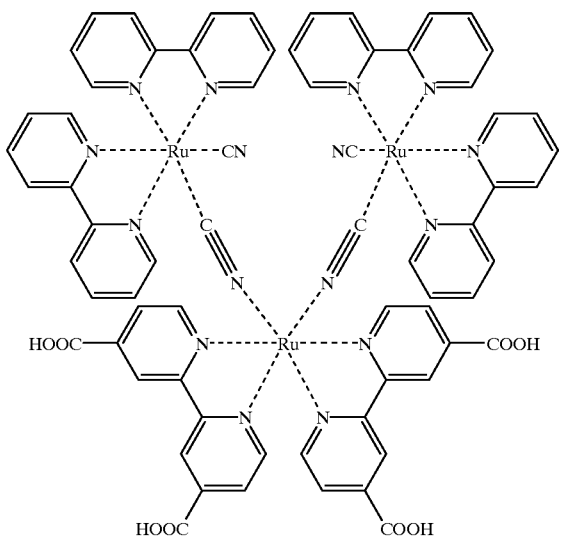

What is claimed is:

1. A photosensitive semiconductor electrode comprising a substrate, and thereon a metal oxide porous body comprising an aggregate of metal oxide fine particles having fine pores whose size frequency distribution has a plurality of peaks, and wherein functional molecules are penetrated into and supported inside the metal oxide porous body.

2. A photosensitive semiconductor electrode according to claim 1, wherein said functional molecules are sensitizing dye.

3. A photosensitive semiconductor electrode according to claim 1, wherein at least one of said plurality of peaks in the size frequency distribution of the fine pores is a peak corresponding to a circle equivalent radius ranging from $1.0\times10^2$ to $1.0\times10^4$ Å and at least one other of the plurality of peaks is a peak corresponding to a circle equivalent radius ranging from 10 to $10^2$ Å.

4. A photosensitive semiconductor electrode according to claim 1, wherein at least one of said plurality of peaks in the size frequency distribution of the fine pores is a peak corresponding to a circle equivalent radius ranging from $5.0\times10^2$ to $5.0\times10^3$ Å and at least one other of the plurality of peaks is a peak corresponding to a circle equivalent radius ranging from 10 to less than $1.0\times10^2$ Å.

5. A photosensitive semiconductor electrode according to claim 1, wherein the metal oxide is selected from the group consisting of titanium oxide, zinc oxide, tungsten oxide, vanadium oxide, tin oxide, copper oxide or strontium titanate.

6. A method of manufacturing a photosensitive semiconductor electrode according to claim 1 comprising reacting a precursor of a metal oxide with a compound interacting with the precursor in a solvent to prepare a complex gel, further reacting the complex gel to produce a colloidal dispersion sol of metal oxide fine particles, applying a solution of the sol on a substrate, sintering the substrate to form thereon a metal oxide porous body comprising an aggregate of metal oxide fine pores whose size frequency distribution has a plurality of peaks, and dipping the sintered substrate in a liquid containing functional molecules and then allowing the functional molecule to penetrate inside of the metal oxide porous body so that the functional molecules are penetrated into and supported inside the metal oxide porous body.

7. A photoelectric converter comprising a photosensitive semiconductor electrode comprising a substrate, and thereon a metal oxide porous body comprising an aggregate of metal oxide fine particles having fine pores whose size frequency distribution has a plurality of peaks, and wherein functional molecules are penetrated into and supported inside the metal oxide porous body.

8. A photoelectric converter according to claim 7, further comprising:
- a counter electrode which is disposed against the photosensitive semiconductor electrode;
- a connection means for electrically connecting the counter electrode to the photosensitive semiconductor electrode; and
- an electrolyte interposed between the counter electrode and the photosensitive semiconductor.

9. A photoelectric converter according to claim 7, wherein at least one of said plurality of peaks in the size frequency distribution of the fine pores is a peak corresponding to a circle equivalent radius ranging from $1.0 \times 10^2$ to $1.0 \times 10^4$ Å and at least one other of the plurality of peaks is a peak corresponding to a circle equivalent radius ranging from 10 to $1.0 \times 10^2$ Å.

10. A photoelectric converter according to claim 7, wherein the functional molecules are sensitizing dye.

* * * * *